United States Patent
Ma et al.

(10) Patent No.: US 10,952,348 B2
(45) Date of Patent: Mar. 16, 2021

(54) HEAT DISSIPATION DEVICE

(71) Applicant: ASUSTeK COMPUTER INC., Taipei (TW)

(72) Inventors: Chen-Hsuan Ma, Taipei (TW); Ching Ho, Taipei (TW); Yu-Chen Lee, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 58 days.

(21) Appl. No.: 16/429,247

(22) Filed: Jun. 3, 2019

(65) Prior Publication Data
US 2019/0387640 A1 Dec. 19, 2019

(30) Foreign Application Priority Data
Jun. 13, 2018 (TW) ................................ 107120402

(51) Int. Cl.
*H05K 7/20* (2006.01)
*G06F 1/16* (2006.01)
*G06F 1/20* (2006.01)

(52) U.S. Cl.
CPC ....... *H05K 7/20154* (2013.01); *G06F 1/1633* (2013.01); *G06F 1/203* (2013.01); *H05K 7/20172* (2013.01)

(58) Field of Classification Search
CPC .......... H05K 7/20154; H05K 7/20145; H05K 7/20172; H05K 7/20909; G06F 1/20; G06F 1/202; H01L 23/467; F04D 29/582; F04D 29/4246
See application file for complete search history.

(56) References Cited

U.S. PATENT DOCUMENTS

| 5,335,143 | A  | * | 8/1994  | Maling, Jr. ........ H05K 7/20154 |
|           |    |   |         | 165/122                          |
| 6,422,303 | B1 |   | 7/2002  | Ishida et al.                    |
| 7,273,091 | B2 | * | 9/2007  | Bahl ..................... H01L 23/427 |
|           |    |   |         | 165/104.33                       |
| 7,333,336 | B2 | * | 2/2008  | Kim ..................... H01L 23/427 |
|           |    |   |         | 165/104.33                       |
| 7,640,968 | B2 |   | 1/2010  | Peng et al.                      |
| 7,775,062 | B2 |   | 8/2010  | Blomquist                        |
| 9,409,264 | B2 | * | 8/2016  | Gilliland ............. H01L 23/3672 |
| 2003/0231468 | A1 | * | 12/2003 | Lopatinsky ............. F04D 17/04 |
|           |    |   |         | 361/697                          |

(Continued)

FOREIGN PATENT DOCUMENTS

TW 536131 U 6/2003

OTHER PUBLICATIONS

Thermaltake SpinQ CPU Cooler, May 25, 2009, http://www.cdrinfo.com/Sections/Reviews/Print.aspx?ArticleId=25391.

*Primary Examiner* — Nathaniel E Wiehe
*Assistant Examiner* — Ryan C Clark
(74) *Attorney, Agent, or Firm* — McClure, Qualey & Rodack, LLP

(57) ABSTRACT

A heat dissipation device includes a housing and a fan. The housing includes a base and a plurality of fins. The fins are connected to the base and are arranged sequentially along a direction. The plurality of fins each have an opening, and the openings are communicated to form a space. The fan is disposed inside the space and is configured to rotate about an axis parallel to the direction.

9 Claims, 3 Drawing Sheets

(56) References Cited

U.S. PATENT DOCUMENTS

| | | | |
|---|---|---|---|
| 2004/0129409 A1* | 7/2004 | Mok | F04D 29/582 |
| | | | 165/80.3 |
| 2005/0161199 A1* | 7/2005 | Ma | H01L 23/467 |
| | | | 165/104.33 |
| 2015/0208547 A1* | 7/2015 | Gonzalez | H01L 23/467 |
| | | | 165/80.3 |
| 2018/0255662 A1* | 9/2018 | Fan | G06F 1/20 |

* cited by examiner

HEAT DISSIPATION DEVICE

CROSS-REFERENCE TO RELATED APPLICATION

This application claims the priority benefit of Taiwan Application Serial No. 107120402, filed on Jun. 13, 2018. The entirety of the above-mentioned patent application is hereby incorporated by reference herein and made a part of specification.

BACKGROUND OF THE INVENTION

Field of the Invention

The invention relates to a heat dissipation device.

Description of the Related Art

A heat dissipation device such as fins is used in a computer system to assist in removing heat generated by electronic components. The fins are commonly equipped with a fan to improve the cooling efficiency by convection from the airflow passing the fins.

Currently, the fan is disposed beside the fins when the heat dissipation device equips with the fan. However, the above configuration is not ideal in space utilization. Under a condition that a space is limited (such as cooling of a voltage regulating module on a motherboard), and only a small fan is suitable to disposed on, the cooling capacity is thus limited accordingly.

BRIEF SUMMARY OF THE INVENTION

The disclosure provides a heat dissipation device with small dimension and having high cooling efficiency.

The disclosure provides a heat dissipation device having a housing and a fan. The housing includes a base and a plurality of fins. The fins are arranged sequentially along a direction and are connected to the base. The fins each have an opening, and the openings are communicated to form a space. The fan is disposed inside the space and is configured to rotate about an axis parallel to the direction.

The heat dissipation device of the disclosure increases a cooling area by the fins on the housing. The fan is used for generating airflow flowing through the housing for cooling in a manner of convection. The fan is disposed in the hollow housing, so that the heat dissipation device of the disclosure has a smaller volume, and provides high cooling efficiency even under a condition that the space is limited.

DETAILED DESCRIPTION OF THE EMBODIMENTS

A plurality of embodiments of the disclosure is disclosed below with reference to the accompanying drawings, in which elements are not drawn to scale and which are provided only for describing the disclosure. Numerous practical details are set forth below to provide a thorough understanding of the disclosure. However, it will be understood by those of ordinary skill in the relevant art that the disclosure may be practiced without one or more of these practical details and therefore are not intended to limit the disclosure.

Figure 1:
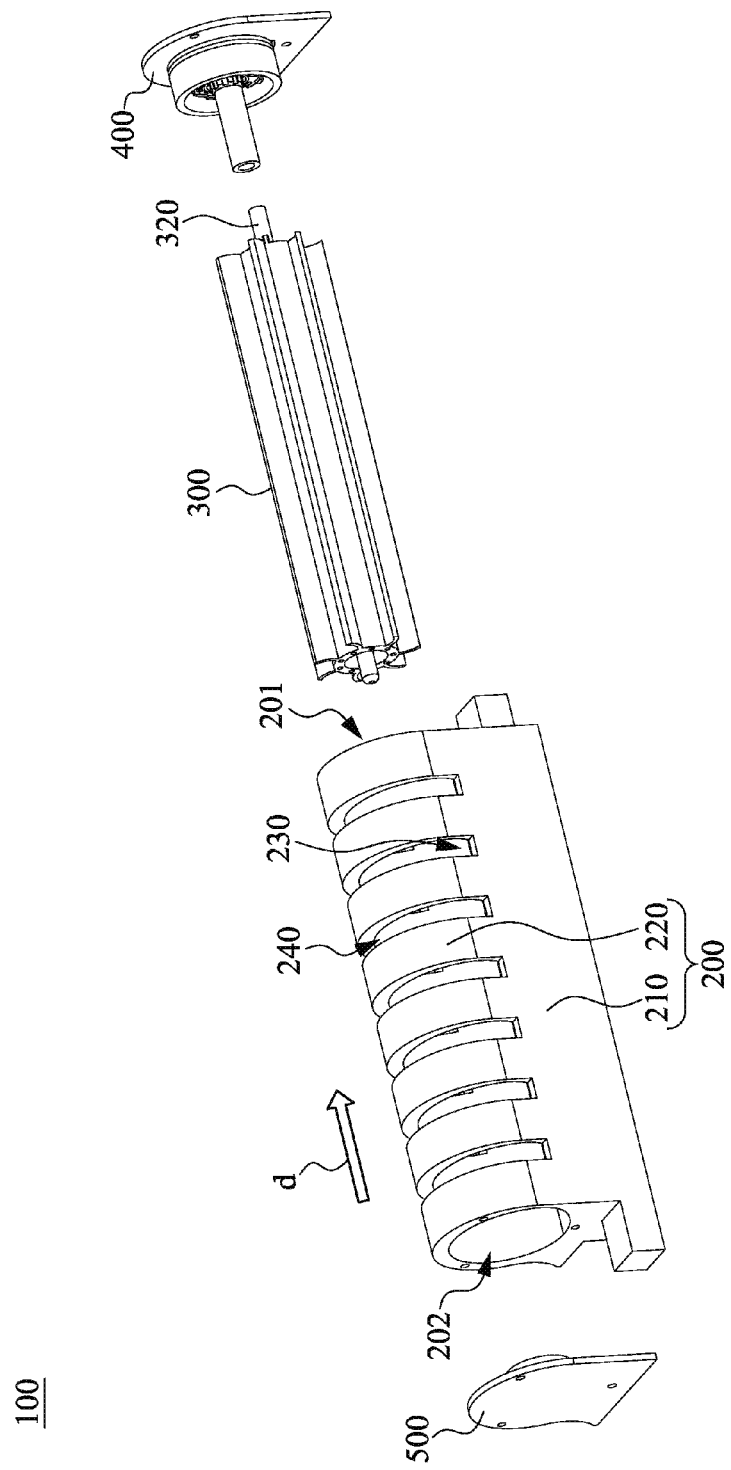
FIG. 1 is an exploded view of a heat dissipation device according to an embodiment of the disclosure.
Figure 2:
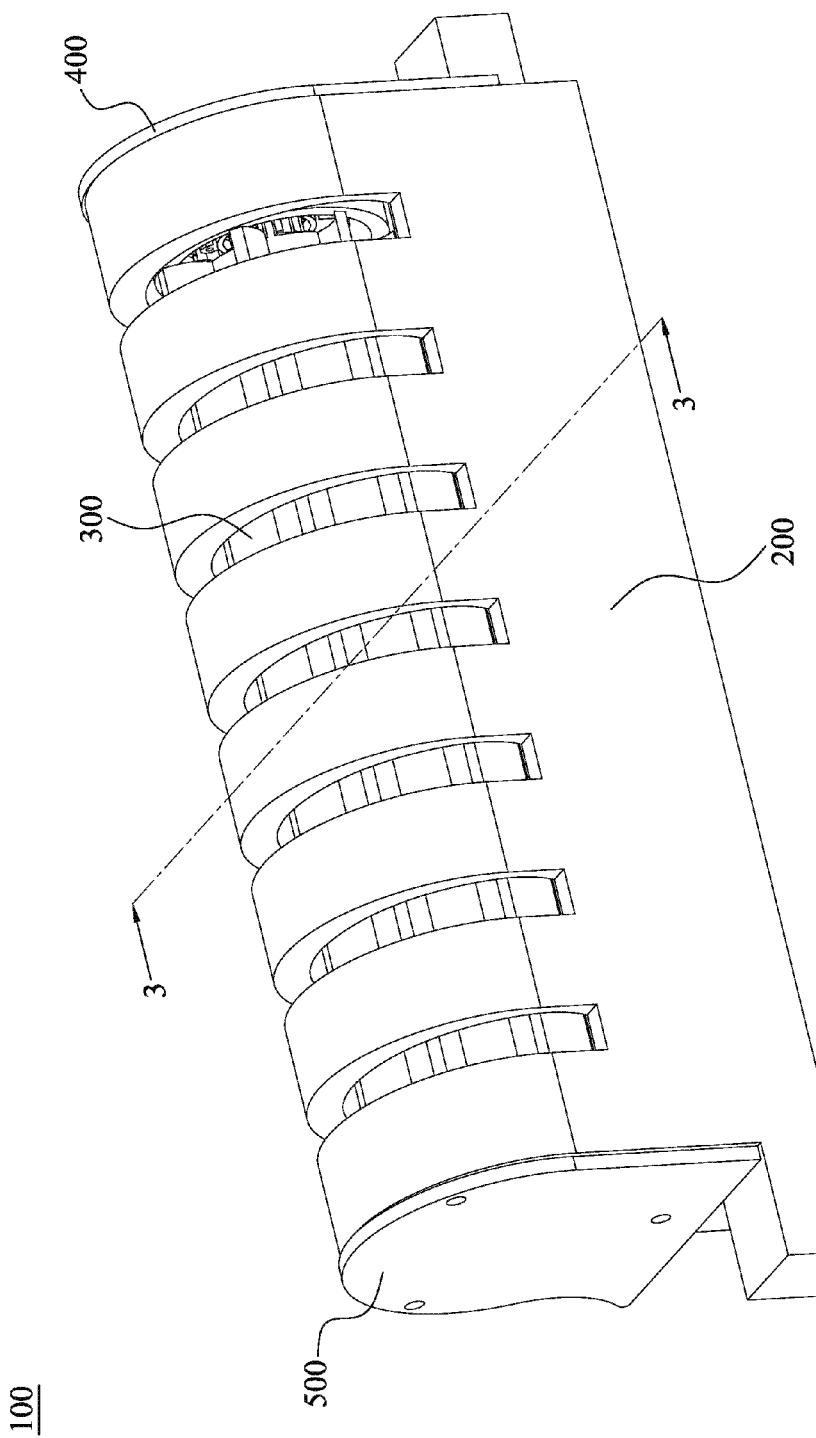
FIG. 2 is an assembled view of the heat dissipation device of FIG. 1.

Referring to FIG. 1 and FIG. 2. FIG. 1 is an exploded view of a heat dissipation device 100 according to an embodiment of the disclosure, and FIG. 2 is an assembled view of the heat dissipation device 100 of FIG. 1. The heat dissipation device 100 includes a housing 200 and a fan 300, wherein the housing 200 includes a base 210 and a plurality of fins 220. The fins 220 are sequentially arranged in a direction d, and are connected to the base 210. The base 210 is configured to be in contact with a heat source (not shown in the figures, such as a voltage regulating module arranged on a motherboard), heat generated by the heat source is transmitted to the fins 220 in a manner of heat conduction through the base 210, and then is dissipated into air in a manner of heat convection by a cooling area provided by the fins 220. In some embodiments, a shape of a bottom of the base 210 is configured to be matched with the heat source, and a contact area of the heat dissipation device 100 and the heat source is increased, so that heat conduction efficiency between the heat dissipation device 100 and the heat source is improved.

Figure 3:
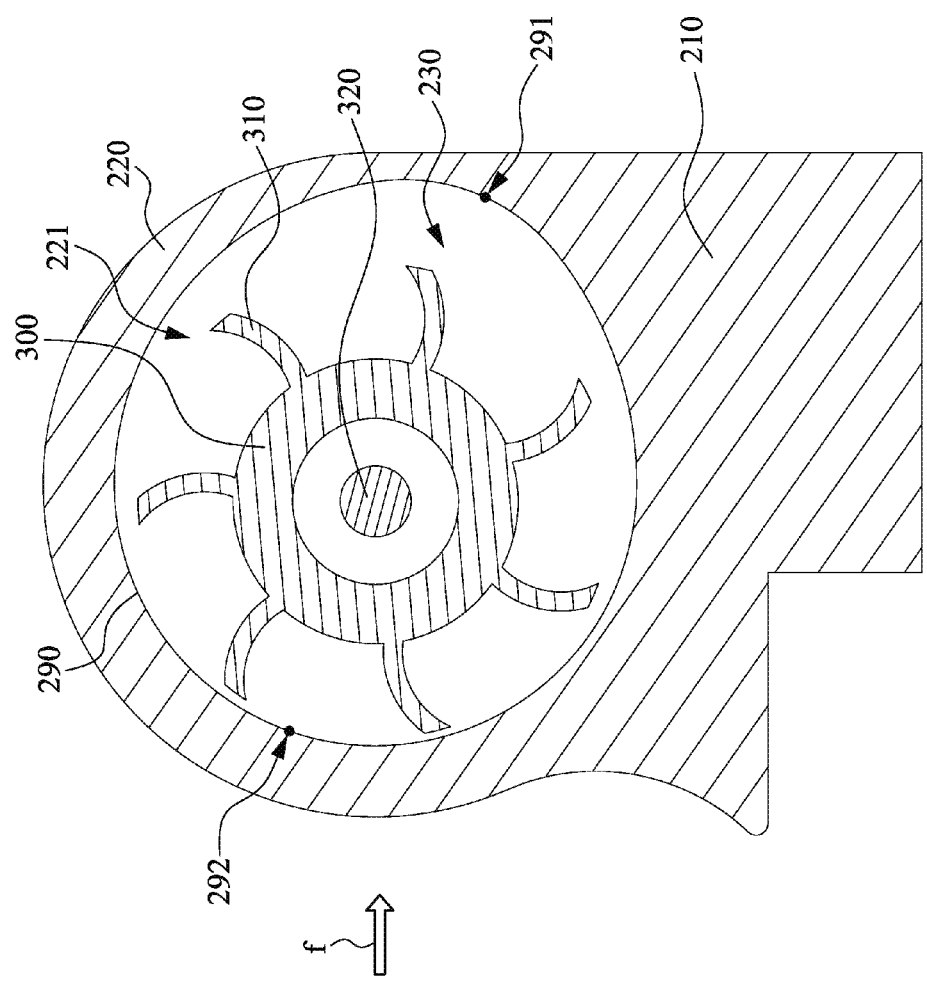
FIG. 3 is a cross-sectional view of the heat dissipation device of FIG. 2 along a line segment 3-3.

The fins 220 each have an opening 221 (as shown in FIG. 3), the opening are communicated to form a space 230, and the space is located between the fins 220 and the base 210. The fan 300 is disposed in the space 230, and configured to rotate about an axis parallel to the direction d. The fan 300 is used for generating airflow passing the housing 200, and cooling efficiency is improved by increasing heat convection.

As shown in FIG. 1 and FIG. 2, in some embodiments, the cooling fin 220 is bent towards the base 210, and two ends are both connected to the base 210. A gap 240 exists between any two adjacent fins 220, and the gap 240 is communicated with the space 230. When the fan 300 operates, airflow outside the housing 200 is inhale into the space 230 from one side (such as a left side as shown in FIG. 3) of the gap 240, then the airflow is exhale outside the housing 200 from the other side (such as a right side as shown in FIG. 3) of the gap 240, and airflow flowing through the cooling fin 220 and the base 210 efficiently takes away heat from the heat dissipation device 100.

In some embodiments, the heat dissipation device 100 further includes a fan base 400 and a bearing 500. The fan base 400 and the bearing 500 are connected to the housing 200, the fan 300 has a rotating shaft 320, one end of the rotating shaft 320 is rotatably connected to the fan base 400, and the other end of the rotating shaft 320 is rotatably connected to the bearing 500.

In some embodiments, the housing 200 has a first side opening 201 and a second side opening 202 opposite to each other and communicated with the space 230. The first side opening 201 is covered with the fan base 400 and the fan base 400 partially extends into the space 230 through the first side opening 201, and the second side opening 202 is covered with the bearing 500 and the bearing 500 partially extends into the space 230 through the second side opening 202, the volume of the heat dissipation device 100 is decreased, and rotation of the fan 300 is stabilized. In some other embodiments, the fan base 400 is connected to the base 210, so that a gap exists between the fan base 400 and the cooling fin 220 beside the first side opening 201. Similarly, the bearing 500 is connected to the base 210, so that a gap exists between the bearing 500 and the cooling fin 220 beside the second side opening 202. Except the gap 240, the airflow also passes the above gaps, and the amount of the airflow passing the heat dissipation device 100 is increased, so that convection cooling efficiency is further improved.

Referring to FIG. 3, it is a cross-sectional view of the heat dissipation device 100 of FIG. 2 along a line segment 3-3. In some embodiments, as shown in FIG. 3, a smooth peripheral surface formed by the base 210 and the cooling fin 220 faces the space 230, and noise generated due to operation of the heat dissipation device 100 is lowered.

In some embodiments, an inner edge 290 of a cross section passing the base 210 and the cooling fin 220 is a smooth curve. The inner edge 290 has a farthest first end point 291 and a second end point 292, and a curvature of the first end point 291 is greater than that of the second end point 292.

In FIG. 3, the fan 300 rotates clockwise, and is configured to have a plurality of backwards-bent fan blades 310 extending parallel with the direction d, but the disclosure is not limited herein. The backwards-bent fan blade refers to a fan blade with a tail end bent in a direction opposite to a rotating direction of the fan. In an embodiment, in FIG. 3, the tail end of the backwards-bent fan blade 310 is bent in an anticlockwise direction opposite to the rotating direction of the fan 300. Considering a shape of the inner edge 290 of the embodiment and a position of the fan 300, the fan 300 is equipped with the backwards-bent type fan blade and thus noise generated during operation of the heat dissipation device 100 is avoided.

As shown in FIG. 3, a distance from the first end point 291 to the base 210 is less than a distance from the second end point 292 to the base 210, that is, a connection line of the first end point 291 and the second end point 292 is inclined in a lower right-upper left direction in FIG. 3. Besides, a distance from the rotating shaft 320 of the fan 300 to the first end point 291 is greater than a distance from the rotating shaft 320 to the second end point 292, that is, a position of the fan 300 slightly deviates to the second end point 292 less in curvature, but not located in a middle of the space 230.

Via the above-mentioned structural configuration, the airflow f horizontally enters the space 230 from a left side of the housing 200 through the gap 240 in essence during operation of the fan 300, then horizontally leaves the space 230 from a right side of the housing 200 through the gap 240 in essence after flowing through the base 210 and the heat dissipation device 220, and takes away the heat transmitted to the housing 200 by the heat source.

To sum up, the heat dissipation device of the disclosure increases the cooling area by the fins on the housing, includes the fan used for generating the airflow flowing through the housing, and performs cooling in the manner of convection. The fan is disposed in the hollow housing, so that the heat dissipation device of the disclosure has a smaller volume, and provides high cooling efficiency under a condition that the space is limited.

Although various embodiments of the disclosure have been described above, it is to be understood that they have been presented by way of example only and not limitation. Various modifications may be made without departing from the spirit and scope of the disclosure. Therefore, the scope of the disclosure should be as defined by the appended claims.

What is claimed is:

1. A heat dissipation device, comprising:
   a housing, comprising:
   a base; and
   a plurality of fins, each having an opening and arranged sequentially along a direction and connected to the base, wherein the openings are communicated with each other to form a space; and
   a fan, disposed inside the space and configured to rotate about an axis parallel to the direction;
   wherein an inner edge of a cross section passing the base and one of the plurality of fins has a farthest first end point and a second end point, and a curvature of the first end point is greater than that of the second end point.

2. The heat dissipation device according to claim 1, wherein two ends of each of the plurality of fins are both connected to the base.

3. The heat dissipation device according to claim 1, wherein a smooth peripheral surface formed by the base and one of the plurality of fins faces the space.

4. The heat dissipation device according to claim 1, wherein a distance from the axis to the first end point is greater than a distance from the axis to the second end point.

5. The heat dissipation device according to claim 1, wherein a distance from the first end point to the base is less than a distance from the second end point to the base.

6. The heat dissipation device according to claim 1, wherein the fan has a plurality of backwards-bent fan blades which extend parallel with the axis.

7. The heat dissipation device according to claim 1, further comprising:
   a fan base, connected to the housing, wherein the fan has a rotating shaft, and one end of the rotating shaft is rotatably connected to the fan base; and
   a bearing, connected to the housing, wherein the other end of the rotating shaft is rotatably connected to the bearing.

8. The heat dissipation device according to claim 7, wherein the housing has a first side opening communicated with the space, and the fan base partially extends into the space through the first side opening.

9. The heat dissipation device according to claim 8, wherein the housing has a second side opening opposite to the first side opening and communicated with the space, and the bearing partially extends into the space through the second side opening.

* * * * *